(12) United States Patent
Bailey et al.

(10) Patent No.: US 6,473,334 B1
(45) Date of Patent: Oct. 29, 2002

(54) MULTI-PORTED SRAM CELL WITH SHARED BIT AND WORD LINES AND SEPARATE READ AND WRITE PORTS

(75) Inventors: Daniel William Bailey, Northboro; Stephen Felix, Cambridge; Stephen E. Liles, Shrewsbury, all of MA (US)

(73) Assignee: Compaq Information Technologies Group, L.P., Houston, TX (US)

( * ) Notice: Subject to any disclaimer, the term of this patent is extended or adjusted under 35 U.S.C. 154(b) by 0 days.

(21) Appl. No.: 10/003,335

(22) Filed: Oct. 31, 2001

(51) Int. Cl.[7] .............................................. G11C 11/00
(52) U.S. Cl. ...................... 365/154; 365/154
(58) Field of Search ........................... 365/154, 189.05, 365/192

(56) References Cited

U.S. PATENT DOCUMENTS 5,469,380 A * 11/1995 Iio ............................... 365/154
6,046,942 A * 4/2000 Hwang et al. ............... 365/154

* cited by examiner

Primary Examiner—Vu A. Le
(74) Attorney, Agent, or Firm—Conley, Rose & Tayon, P.C.; Michael F. Heim

(57) ABSTRACT

A multi-ported SRAM memory cell includes a pair of inverters that holds the data bit. The state terminals of the memory cell connect via a separate read and write data path to the bit lines. The read bit lines connect to a pull-down transistor stack. The first transistor in the stack is gated by the word line, and the second transistor is gated by the state terminal of the memory cell. If the word line is asserted and the second transistor is turned on by the state of the memory cell, the bit line is connected to ground, thus pulling the bit line low. Conversely, if the second transmitter is not turned on, the bit line stays at a high voltage level. In a preferred embodiment, the memory cell is isolated from the pull-down transistor stack by an isolation buffer, such as an inverter, which inverts the voltage on the state terminal of the memory cell. The write data path couples to the memory cell through an access transistor, and also through a second gate that operates to restrict current leakage from the bit lines. In the preferred embodiment, the second gate comprises a current choke that limits current flow to the memory cell during a read operation. Alternatively, the second gate may comprise a transistor that is gated by a write enable signal.

40 Claims, 4 Drawing Sheets

100

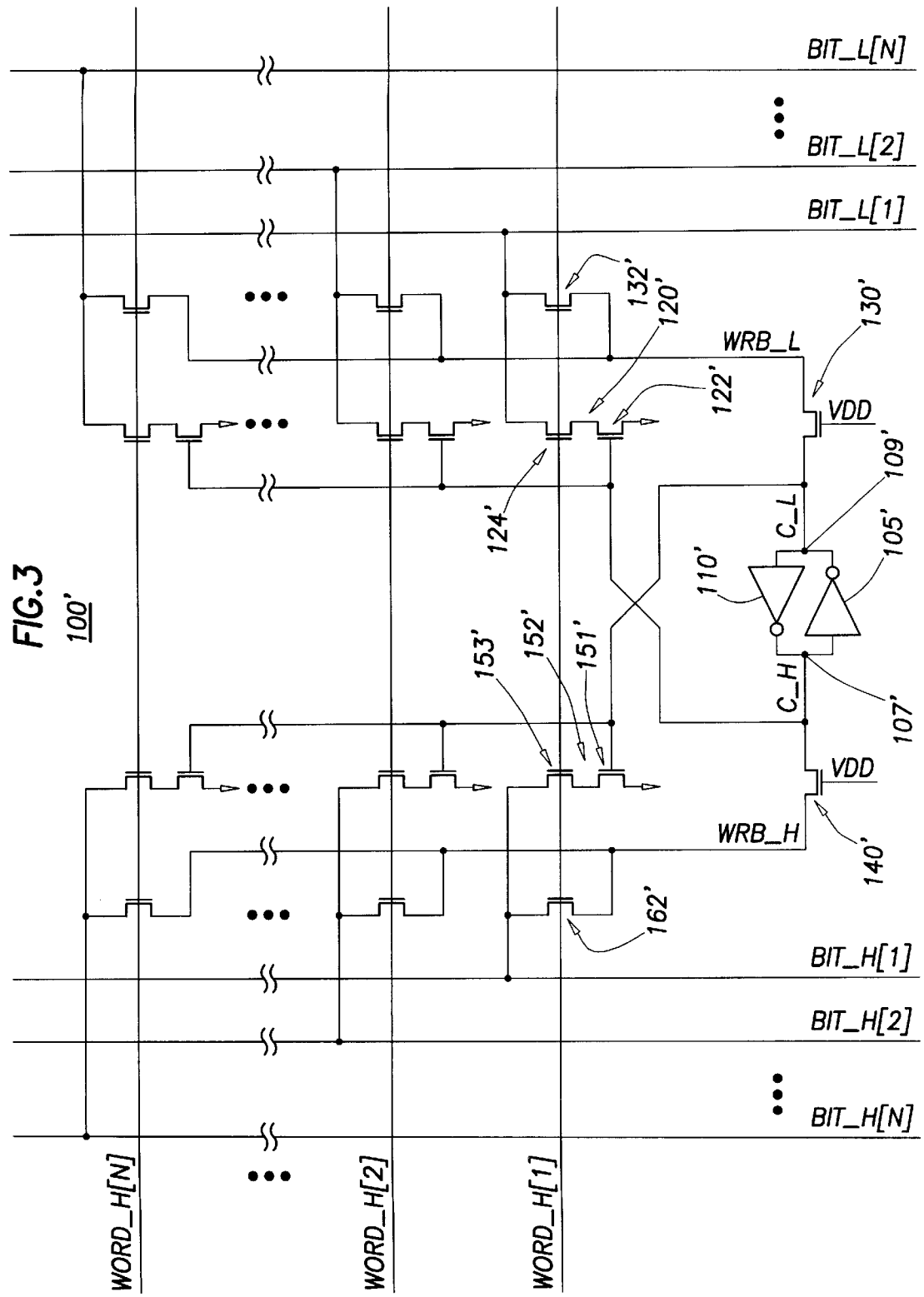

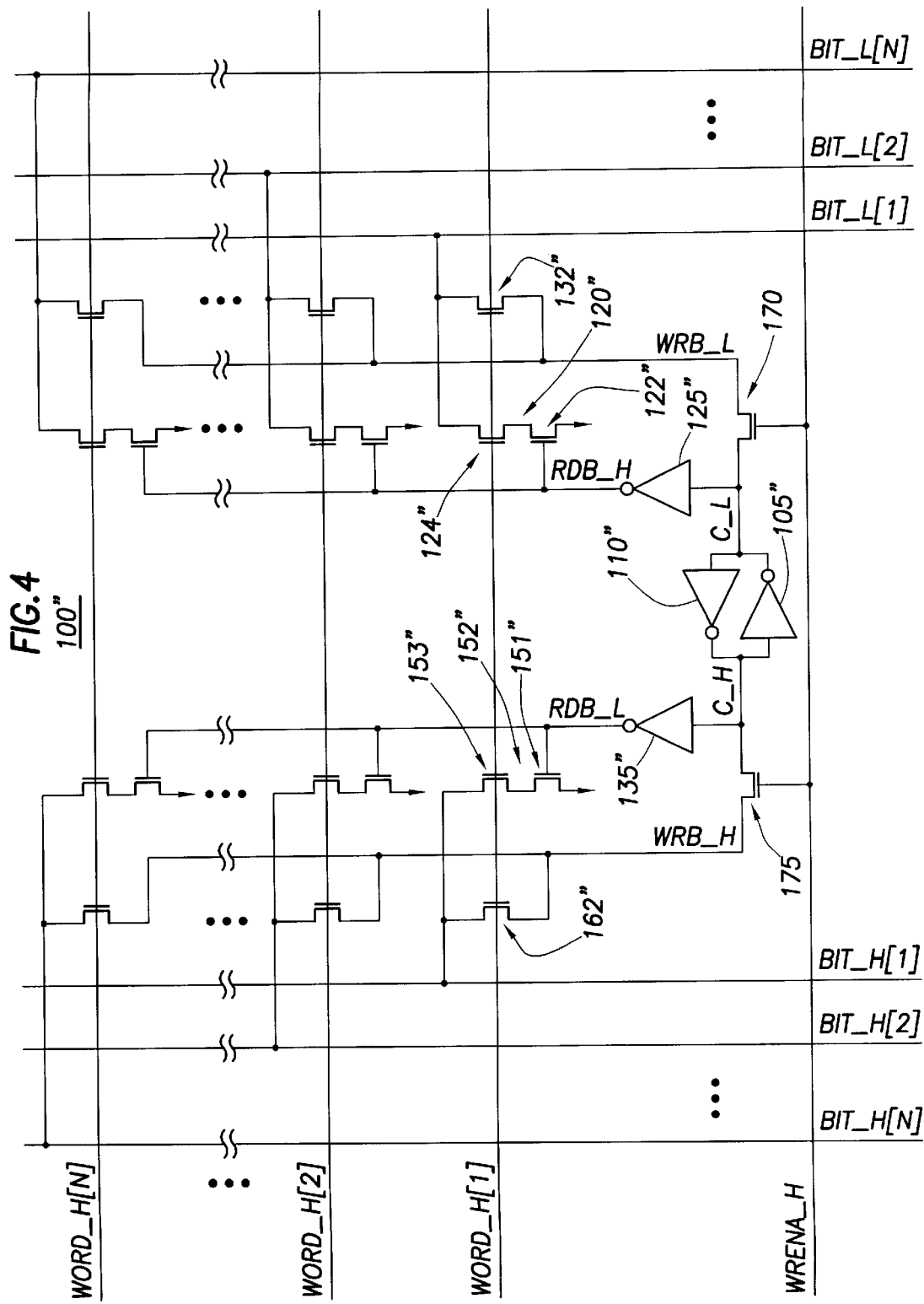

MULTI-PORTED SRAM CELL WITH SHARED BIT AND WORD LINES AND SEPARATE READ AND WRITE PORTS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to a memory element that stores data as part of a memory cache, register file, or other memory array. More particularly, the present invention relates to a static random access memory (SRAM) element that is implemented with a plurality of ports, which can simultaneously access the memory element.

2. Background of the Invention

Memory devices store and retrieve large quantities of digital data. Memory capacities in digital systems are commonly expressed in terms of bits (binary digits), since a separate storage element is used to store each bit of data. Each storage element is referred to as a cell. Memory capacities are also sometimes quantified in terms of bytes (8 or 9 bits) or words (which may be arbitrarily defined, but commonly comprises 16 or more bits). Every bit, byte, or word is stored in a particular location, identified by a unique numeric address. Typically, one or more bytes of data is stored or retrieved during each cycle of a memory operation.

The performance of computer systems has continued to increase at a remarkable rate, while the cost has decreased just as dramatically. Part of the reason for this increased performance with decreased cost is attributable to the dramatic reduction in the cost of memory elements, while the speed and performance has increased. Current memory devices are smaller, operate at a higher speed, consume less power, and operate more reliably than the memory products that were on the market only a few years ago.

The most flexible digital memories are those that allow for data storage (or writing) as well as data retrieval (reading). Memories in which both of these functions can be rapidly and easily performed, and whose cells can be accessed in random order (independent of their physical locations), are referred to as random-access memories (RAMs). Read-only memories (ROMs) are those in which only the read operation can be performed rapidly. Entering data into a ROM is referred to as programming the ROM. This operation is much slower than the writing operation used in RAMs.

The storage cells in a typical semiconductor memory are arranged in an array consisting of horizontal rows and vertical columns. Each cell shares electrical connections with all the other cells in its row or column. The horizontal lines (which enable reading and writing operations) connect to all the cells in the row and are called word lines. The vertical lines (along which data flows into and out of the cells) are referred to as bit lines. Each cell therefore has a unique memory location, or address, which can be accessed at random through the selection of the appropriate word and bit line. Some memories are designed so that all the cells in a row are accessed simultaneously. This array configuration of semiconductor memories lends itself well to the regular structured designs that are favored in very large scale integrated circuits.

In semiconductor RAMs, information is stored in each cell either through the charging or discharging of a capacitor or the setting of the state of a bi-stable latch circuit. With either method, the information on the cell is destroyed if the power is interrupted. Such memories are therefore referred to as volatile memories. When the charge on a capacitor is used to store data in a semiconductor-RAM cell, the charge needs to be periodically refreshed, since leakage currents will remove it in a few milliseconds. Hence, volatile memories based on this storage mechanism are known as dynamic RAMs, or DRAMs. If the data is stored (written) by setting the state of a latch, it will be retained as long as power is connected to the cell (and latch is not overwritten by another write signal). RAMs fabricated with such cells are known as static RAMs, or SRAMs. Unlike DRAM cells, there is no need to refresh the cell to maintain the state of the cell.

One of the important criteria is that the memory cell does not lose its data (or change state) during a read operation. Thus, the memory cell must be stable under all normal reading conditions to ensure proper operation. At the same time, the memory cell must be writable to permit the contents of the cell to be modified when instructed by the system. In addition, the memory cell must have noise margins that are reasonable so that the memory cell holds its state even in the event that noise is present on the word lines or bit lines.

In some designs, it is desirable to have more than one read operation at a time. A dual ported memory array can support two simultaneous read operations, either from the same cell or from two cells in the same array. One cell of a conventional dual-ported SRAM array is shown in FIG. 1 for purposes of illustration. The memory array would include a plurality of memory cells constructed in much the same fashion. With a multi-ported SRAM cell, the ability to maintain the memory state of the cell during simultaneous read operations on the different ports becomes more difficult to achieve because current drawn through the access transistors increase the voltage on the "0" side of the latch. If not properly designed, a read operation from multiple ports could "disturb" the state of the memory cell. As shown in FIG. 1, the memory cell 5 is comprised of a pair of latches (shown as inverters 10, 15) that store or hold the data. The inverters 10, 15 work in conjunction to store a data bit value. If the output of inverter 10 is a low voltage state (i.e., a "0"), then the output of inverter 15 will be a high voltage state (i.e., a "1"). Consequently, each side of the memory cell 5 is maintained at a different logical value. The state of these logical values determines whether the memory cell is storing a "0" or a "1". For example, if the output of inverter 10 is a "1", and the output of inverter 15 is a "0", this may represent a "1" in the memory cell 5. Conversely, if the output of inverter 10 is a "0", and the output of inverter 15 is a "1", this may represent a "0" in the memory cell 5. Although only one memory cell is shown in FIG. 1, one skilled in the art will understand that multiple memory cells are configured horizontally and vertically in a two dimensional array.

Typically, a word line accesses each memory cell in a particular horizontal row. FIG. 1 shows a dual-ported SRAM cell, and thus two word lines access each memory cell in a horizontal row. In FIG. 1, these word lines are represented as wordline 1 and wordline 2. To read data from port 1, wordline 1 is asserted, thus turning on access transistors 12, 14, and thereby enabling the state of inverters 10, 15 to be read by associated port 1 bit lines. Conversely, to read data from port 2, wordline 2 is asserted, turning on access transistors 16, 18, and thereby enabling the associated port 2 bit lines to read the state of the memory cell 5.

Data is read from the memory cell 5 on two complementary bitlines, which typically are shown as extending vertically in a memory diagram. In accordance with this convention, FIG. 1 shows a low bit line and a high bit line connected to each memory cell. Thus, for example, bitline_L(1) and bitline_H(1) are used to access data in conjunction with wordline 1. When wordline 1 is asserted, the access transistor gates 12, 14 (shown as field effect transistors, or FETs) turn-on, permitting the state of inverter 10 to be read on bitline_H(1), and the state of inverter 15 to be read on bitline_L(1). If bitline_H(1) goes high, and bitline_L(1) goes low, this signals that the state of memory cell is a "1" (although a different convention could be used, if desired). Conversely, if bitline_H(1) goes low, and bitline_L(1) goes high, this signals that the state of memory cell is a "0". The voltage levels of bitline_L(1) and bitline_H(1) are compared in a sense amp (not shown) to determine the state of the memory cell. In similar fashion, wordline 2 and access FETs 16, 18 are used to access the memory cell to have data read out on bitline_L(2) and bitline_H(2).

According to normal convention, only one word line at a time (i.e., only one port at a time) can write to the memory cell to avoid conflicts. Moreover, typically no other word line can be asserted during a write operation to prevent another port from reading from the cell during a write operation. During write operations, the appropriate bit line is pulled to ground, and the corresponding word line is asserted. This voltage differential causes a "0" to be written on one side of the cell.

While write operations can only be performed on one port at a time, in certain instances read operations may be performed on multiple ports simultaneously. During read operations, each bit line is charged to the power supply voltage $V_{DD}$. For a multi-ported RAM cell, multiple bit lines and word lines are connected to each cell. When a read operation is performed on multiple ports, a large amount of current may be drawn into the memory cell. If the state terminal of the memory cell is at a logical "0", the conduction of multiple bit lines (all of which are at $V_{DD}$) will result in a current flow from the bit lines to the state terminal of the memory cell, and may potentially cause the memory cell state terminal to increase in voltage from a logical "0" state to a logical "1" state. Thus, in a situation where multiple reads occur simultaneously on multiple ports, the side of the memory cell with a "0" may have its voltage level raised, and thus may change the state of the latch to be a "1". In some multi-ported memory arrays, there may be as many as eight ports. Such a large number of ports exaggerates the problem of disturbing the state of the memory cell during a simultaneous read operation. In particular, if eight low bit lines (bitline_L[ ]) are charged to $V_{DD}$ and access a memory cell simultaneously, the "0" state may be raised to a logic "1" state. Thus, the existence of an excessive number of ports in an SRAM memory array may result in corrupting the stored value in a memory cell.

To date, the solution to this problem has been to limit the number of access ports. Thus, although it may be desirable to provide a certain number of access ports, designers are forced to configure systems with fewer ports, which ultimately leads to bottlenecks in data flow, and to reduced performance of the memory system, and thus the computer system.

BRIEF SUMMARY OF THE INVENTION

The present invention solves the deficiencies of the prior art by isolating the memory cell state terminals from the bit lines. In the preferred embodiment, an isolation inverter couples between the memory cell and each of the bit lines. In addition, the bit lines are selectively connected to ground to determine the state of the memory cell. This is achieved by placing a first transistor and a second transistor in the data path, with the second transistor connected at its source terminal to ground. The first transistor preferably is gated by the appropriate word line. The output of the isolation inverter preferably is used to turn on and off the second transistor. Turning on the second transistor, when the word line is enabled (which turns on the first transistor), effectively couples the associated bit line to ground, thus placing a logic "0" on the bit line. If the second transistor is not turned on by the inverter output when the word line is asserted causes the bit line to stay high, signaling a logic "1". Thus, if the inverted output of that side of the memory cell is a "1", the second transistor turns on, connecting the bit line to ground, thereby pulling the bit line low to represent a logical "0". If the inverted output of the memory cell is "0", the second transistor does not turn on, and the voltage on the bit line remains high, thus representing a logical "1". Consequently, this configuration isolates the memory cell from the bit lines through an isolation inverter, and by using the output of the isolation inverter as a gating signal. As a result, none of the bit lines sink current in the memory cell.

According to one embodiment of the present invention, each bit line couples to a pull-down transistor stack. One of the transistors in the stack is gated by the word line associated with that port. The second transistor is gated by the state terminal of one side of the memory cell. If the word line is asserted and the state of the memory cell activates the second transistor, then the bit line is pulled to ground. If the state of the memory cell does not turn on the second transistor, then the voltage of the bit line remains high. In the preferred embodiment, the memory cell is isolated from the pull-down transistor stack by a buffer. The buffer may comprise an inverter, which inverts the state terminal of the memory cell. In the preferred embodiment, a complementary pair of bit lines is coupled to each side of the memory cell via a pull-down transistor stack.

According to another aspect of the preferred embodiment, different data paths are used to read data from, and write data to, the memory cell. The read data path comprises a path to ground that is selectively gated based on the state of the memory cell. The write data path connects through a write access transistor and a current choke (or current limiter) to the memory cell. During a write operation, the write access transistor is activated, and data can be written to the memory cell. During a read operation, the write port may remain open. The current choke preferably comprises a transistor that limits the amount of current to the state terminal of the memory cell. Thus, even though multiple bit lines may be connected to the memory cell through the write port, the current choke effectively limits the amount of current to the memory cell node while the read operation is transpiring. According to an alternative embodiment, the write port may be closed by gating the choke transistor with a write enable signal.

These and other aspects of the present invention will become apparent upon analyzing the drawings, detailed description and claims, which follow.

BRIEF DESCRIPTION OF THE DRAWINGS

For a detailed description of the preferred embodiments of the invention, reference will now be made to the accompanying drawings in which:

FIG. 3 is a schematic diagram of a multi-ported memory cell constructed in accordance with an alternative embodiment of the present invention; and FIG. 4 is a schematic diagram of a multi-ported memory cell constructed according with another alternative embodiment of the present invention.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections. The term "asserted" refers to a transition of a signal line from its false or inactive state to its true or active state. The true or active state may be either a high or low voltage state. Similarly, the term "de-asserted" refers to a transition of a signal line from its true or active state to its false or inactive state. The false or inactive state may be either a high or a low voltage state. The term "stack" or "transistor stack" refers to two or more transistors that are arranged in a series orientation. To the extent that any term is not specially defined in this specification, the intent is that the term is to be given its plain and ordinary meaning.

DETAILED DESCRIPTION OF THE PREFERRED EMBODIMENTS

Figure 1:
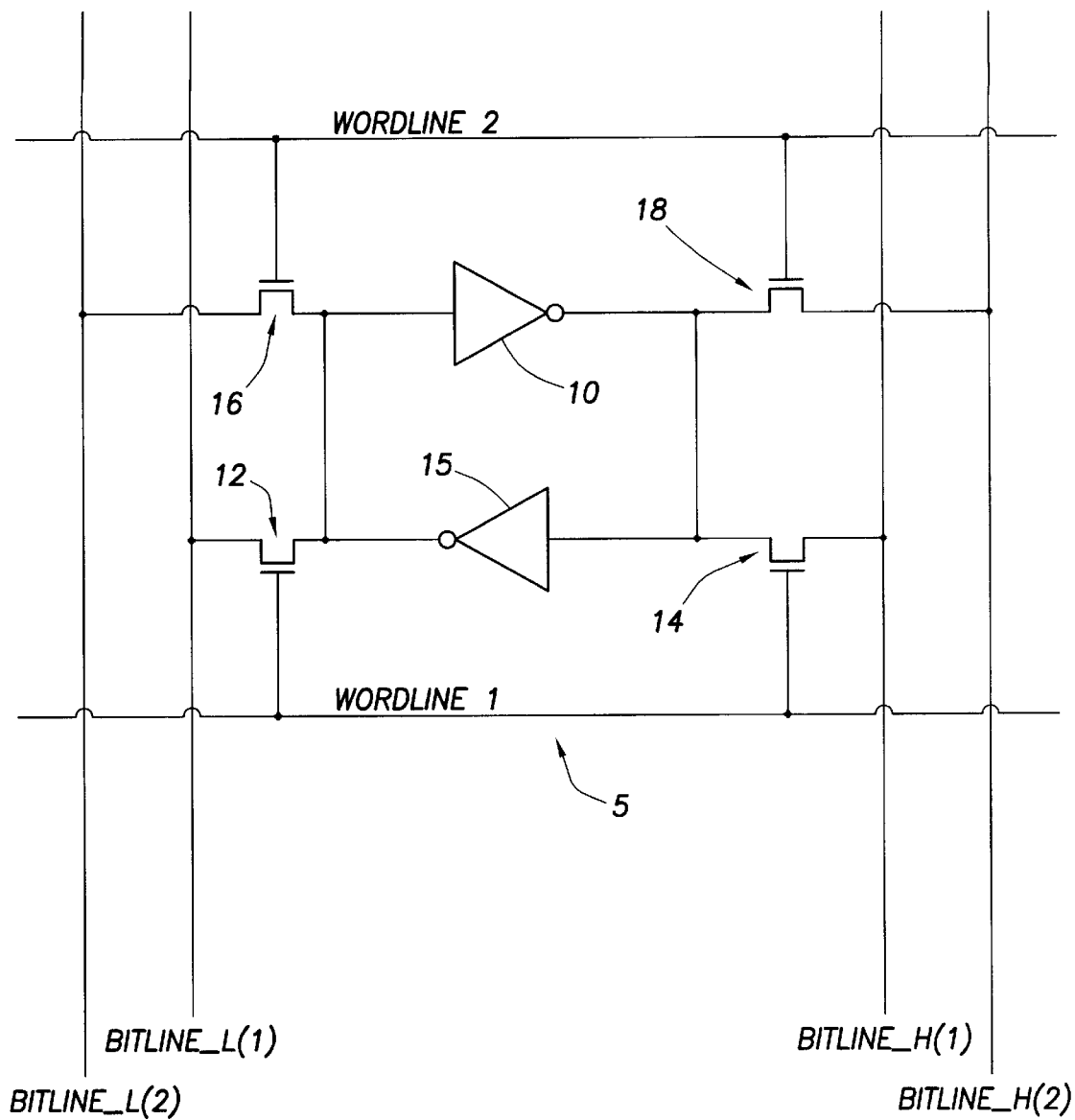
FIG. 1 is a circuit schematic of a conventional prior art memory cell with dual port access.
Figure 2:
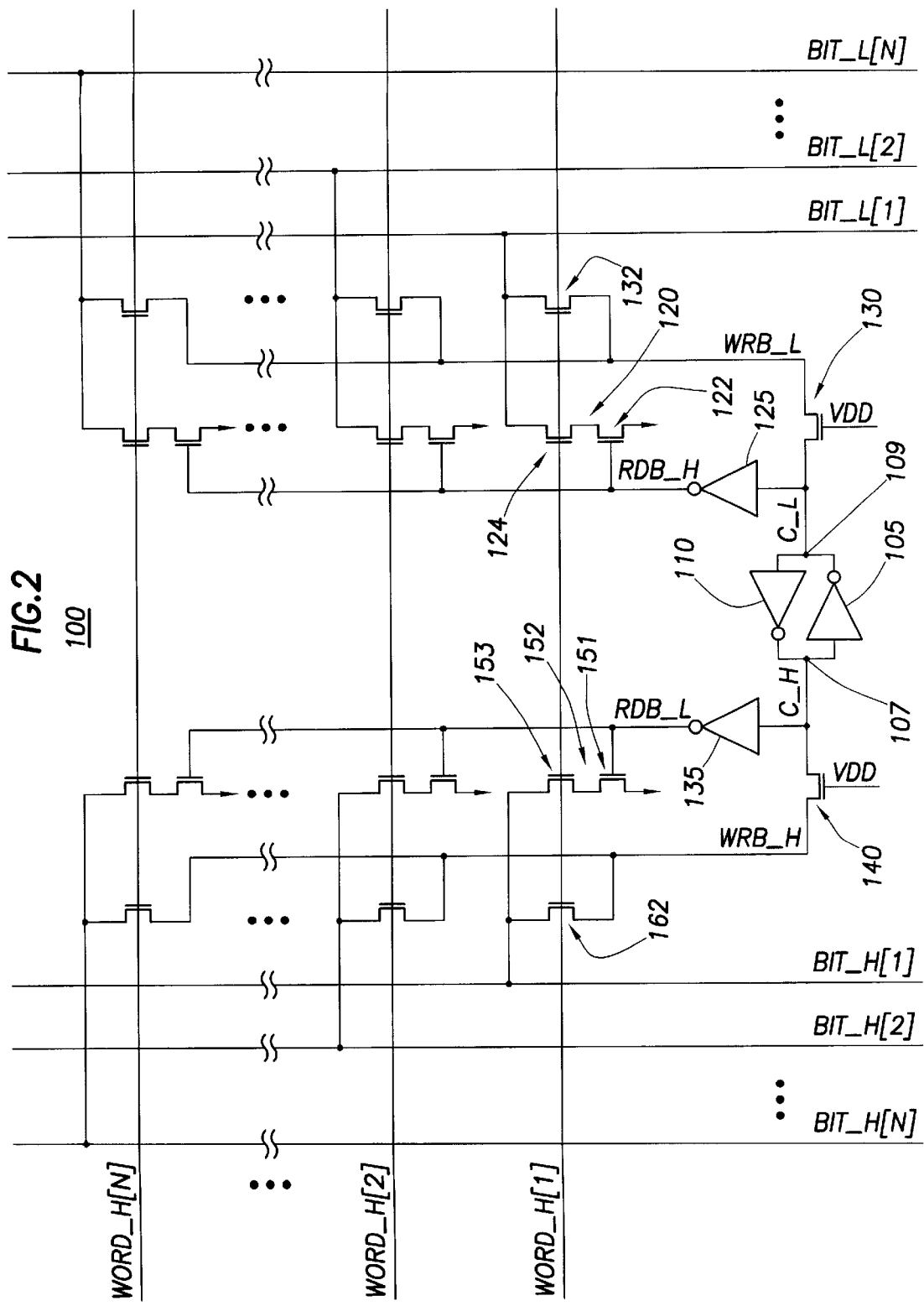
FIG. 2 is a schematic diagram of a multi-ported memory cell constructed in accordance with the preferred embodiment of the present invention.

The present invention discloses an implementation of an SRAM memory cell with associated isolation circuitry that is capable of operating with a large number of ports (defined as N ports in FIGS. 2–4). The implementation of these isolation techniques permits the number of memory ports to be increased by at least an order of magnitude. There are several aspects of the isolation circuitry that will be discussed with reference to FIGS. 2–4.

Referring initially to FIG. 2, a memory cell 100 is depicted with a plurality of ports N. In accordance with normal convention, each of the ports N includes a word line (WORD$_{13}$ H[N]) that enables access to the memory cell 100 by that port, and a complementary pair of bit lines (BIT_H[N] and BIT_L[N]). In FIG. 2, three ports are shown for purposes of illustration. These three ports are port (1), port (2) and port (N), with the understanding that many more ports may be included, if desired. Thus, FIG. 2 includes word lines for each of these ports. Word line WORD_H[1] is the word line associated with port (1); WORD_H[2] is the word line associated with port (2); and WORD$_{13}$ H[N] is the word line associated with port (N). Bit lines BIT_L[1] and BIT_H[1] are the complementary bit lines associated with port (1), while bit lines BIT_L[2] and BIT_H[2] are the complementary bit lines associated with port (2). Similarly, bit lines BIT_L[N] and BIT_H[N] are the complementary bit lines associated with port (N).

The memory cell 100 preferably comprises a pair of inverters (or latches) 105, 110 arranged in a conventional manner to hold the state of a data bit. If the output node 109 of inverter 105 is at a low voltage state (i.e., a "0"), then the output of inverter 110 at node 107 will be at a high voltage state (i.e., a "1"). Consequently, each side of the memory cell 100 is maintained at a different logical value during normal operation. The state of these logical values determines whether the memory cell is storing a "0" or a "1". For example, if node 109 is at a logical "0", and node 107 is at a logical "1", this may represent a "1" in the memory cell 100. Conversely, if node 109 is at a logical "1" and node 107 is at a logical "0", this may represent a "0" in the memory cell 100. Although only one memory cell is shown in FIG. 2, one skilled in the art will understand that multiple memory cells are configured horizontally and vertically in a two dimensional array (or possibly in a three-dimensional array).

Each of the word lines (WORD_H) in FIG. 2 provides an access signal for a corresponding port, with each word line preferably connecting to every memory cell in a particular horizontal row. Data preferably is read from the memory cell 100 on two complementary bitlines, which are shown in FIG. 2 as extending vertically. In accordance with normal convention, each port has an associated low bit line (BIT_L) and high bit line (BIT_H) connected to each memory cell. The following discussion will focus on the manner in which the word line (WORD_H[1]) and bit lines (BIT_L[1] and BIT_H[1]) of port (1) access the memory cell 100 during read and write operations, with the understanding that the word line and bit lines of the other ports are connected to the memory and operate in identical fashion.

Referring still to the preferred embodiment of FIG. 2, each of the complementary bit lines, BIT_L[1] and BIT_H[1], couple to the memory cell 100 through separate read and write data paths. Thus, for example, bit line BIT_L[1] couples to the memory cell 100 via a read bit (RDB_H) data path, and a write bit (WRB_L) data path. Similarly, bit line BIT_H[1] couples to the memory cell 100 via a read bit (RDB_L) data path, and a write bit (WRB_H) data path. The read data path preferably has two sections. The first part of the read data path comprises a pull-down transistor stack 120, 152. The second portion of the read data path comprises the output line of the memory cell 100, and preferably includes an isolation buffer 125, 135.

Thus, taking bit line BIT_L[1] for example, the first portion of the read data path comprises pull-down transistor stack 120, which includes read access transistor 124 and data transistor 122. The gate of read access transistor 124 preferably connects to word line WORD_H[1]. When WORD_H[1] is asserted, read access transistor 124 conducts. Data transistor 122 connects at its source terminal to ground, and at its drain terminal to read access transistor 124. Thus, when transistor 122 is turned on, and read access transistor 124 is on, and the bit line BIT_L[1] connects to ground, pulling it low to a logical "0". If data transistor 122 is not turned on, then bit line BIT_L[1] stays at $V_{DD}$, thus indicating a logical "1".

The second portion of the read data path preferably comprises a buffer 125 connected to memory cell output node 109. In the preferred embodiment, the buffer 125 comprises an inverter. The output of inverter 125 comprises the gate signal for data transistor 122. When a read operation occurs at port (1), each of the bit lines are driven high to the power supply voltage $V_{DD}$. Next, word line WORD_H[1] is asserted, turning on read access transistor 124. At substantially the same time, each of the bit lines are driven high to the power supply voltage $V_{DD}$. When node 109 of memory cell 100 is at "0", the output of inverter 125 is a "1", which turns on data transistor 122, pulling bit line BIT_L[1] to a "0". Conversely, if node 109 is at a logic "1", the output of inverter 125 is a "0", which keeps data transistor 122 off. As a result, bit line BIT_L[1] stays at voltage $V_{DD}$, representing a logic "1".

The configuration of FIG. 2 is doubly effective at isolating the read data path from the memory cell. First, the bit lines sink current through a pull-down transistor stack, instead of through the state terminal of the memory cell. Secondly, a buffer (such as an isolating inverter) is interposed between the bit lines and the memory cell.

The complementary bit line BIT_H[1] of port (1) is connected in identical fashion to the memory cell. Thus, bit line BIT_H[1] connects to pull-down transistor stack 152, which includes access transistor 153 and data transistor 151 connected to ground. The access transistor 153 is gated by the word line WORD_H[1]. The data transistor 151 connects at its gate to the output of inverter 135. Inverter 135 operates to isolate and invert the voltage appearing at node 107 of the memory cell 100. When node 107 is at "0", the transistor 151 turns on, pulling bit line BIT_H[1] to "0". When node 107 is at "1", transistor 151 remains off, leaving bit line BIT_H[1] at a high voltage level (i.e., a "1").

According to the preferred embodiment, each of the other data ports of the multi-ported SRAM cell have read data paths configured in an identical manner. Thus, each of the other bit lines of the other ports have a data path that connects to ground through a pull-down transistor stack. The pull-down transistor stack is gated by the appropriate word line for that port, and by the output of buffer 125.

Referring still to FIG. 2, the write data path will now be described in accordance with the preferred embodiment by once again using BIT_L[1] as exemplary. The write data path of BIT_L[1] preferably includes a write access transistor 132 and a current limiting transistor 130. The access transistor 132 connects at its gate terminal to the word line WORD_H[1]. When WORD_H[1] is asserted, write access transistor 132 conducts. Current limiting transistor (or current choke) 130 preferably connects between write access transistor 132 and output node 109 of the memory cell 100.

Prior to a read operation, each of the bit lines is charged to the power supply voltage $V_{DD}$. During a write operation, data to be written is placed on the bit lines and the appropriate word line is driven high. To avoid conflicts, only one word line can be driven high during a write operation. Thus, for example, if a "1" is to be written to the memory cell 100 through port (1), a "0" would be placed on BIT_L[1], a "1" would be placed on BIT_H[1], and WORD_H[1] would be asserted. The assertion of WORD_H[1] turns on write access transistors 132 and 162, which enables a "0" to be written to node 109 and a "1" to be written to node 107.

In the preferred embodiment of FIG. 2, each of the write data paths (or write ports) is kept open during read operations. To prevent data from being corrupted by the write data path during read operations, current limiting (or choke) transistor 130 is used. During read, multiple ports may be accessed, connecting multiple bit lines (all of which are charged to $V_{DD}$) to the memory cell via the write port. The choke transistor 130 limits the amount of current that flows to the output node 109. Thus, even though multiple bit lines may be connected in parallel to the write path, the choke transistor 130 restricts current flow to the memory cell 100, thereby preventing the collapse of the voltage at terminals 107 and 109. The current limiting operation is achieved in two ways. First, the transistor 130 and the access transistors have a resistive component. When multiple access transistors are turned on, they connect in parallel, thus lowering the effective resistance. Because the choker transistor 130 connects in series, it maintains the resistance above the resistance of the choker transistor 130. In addition, the current through transistor 130 is limited at the saturation level, thereby preventing an excessive amount of current from entering the memory cell. Lastly, it should be noted that if node 109 is at a "0", and a read operation occurs, the low bit lines reading the memory cell will be pulled down as part of the read operation. Thus, choke transistor 130 is faced with only a very transient high voltage condition on the bit lines, and not a persistent voltage as in the case of a write.

Referring now to FIG. 3, an alternative embodiment of the present invention is shown in which isolation buffers 125, 135 are removed. Because the output nodes 107', 109' of memory cell 100' do not couple directly to the bit line data path, but instead couple through the gate of the data transistors 122', 151' in the pull-down transistor stack 120', 152', the isolation buffers of FIG. 2 could be removed to reduce the size of the circuit. Thus, as shown in FIG. 2, the output nodes of the memory cell 100' connect directly to the gates of the data transistors, such as data transistors 120', 151'. In addition, the output node 109' of memory cell 100' connects to the gate of transistor 151', and the output node 107' connects to the gate of transistor 122'. Each of the other data port paths are configured in an identical manner. All other elements are identical to those depicted in FIG. 2, as indicated by the use of the same reference numerals with a single hash mark.

Referring now to FIG. 4, the write data path also can be modified, if desired. Thus, as shown in FIG. 4, the choke transistor of FIG. 2 may be replaced with an enable transistor 170, 175. According to this embodiment, the enable transistors 170, 175 of the write bit paths receive a write enable signal (WRENA_H) at their gate terminals. Thus, transistors 170, 175 only conduct current when enabled by a write signal. The use of enable transistors 170, 175 effectively closes the write data path for each port unless the write enable signal is asserted. All other components in FIG. 4 are configured identically with FIG. 2.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

We claim:

1. An SRAM cell with a plurality of ports capable of simultaneously reading data stored in the SRAM cell, comprising:

a latch that holds a data bit value in the SRAM cell;

a word line associated with each of said plurality of ports;

a pair of bit lines associated with each of said plurality of ports, with each of said bit lines coupling to said latch through a data path and a write path, and wherein the write path comprises an access transistor connected in series to a current limiting transistor; and wherein said data path comprises a pull-down transistor stack comprising a first transistor and a second transistor, and said first transistor is turned on and off by a signal on one of said word lines, and said second transistor is selectively connected to ground based on the data bit value in the SRAM cell.

2. The SRAM cell of claim 1, wherein a first output node of the latch couples to a first isolation buffer and a second output node of said latch couples to a second isolation buffer, and wherein the first isolation buffer couples to the data path of one of said pair of bit lines, and the second isolation buffer couples to the data path of the other of said pair of bit lines.

3. The SRAM cell of claim 2, wherein the first isolation buffer generates an output signal that controls the operation of said second transistor in said data path of one of said pair of bit lines, and the second isolation buffer generates an output signal that controls the operation of said second transistor in said data path of the other of said pair of bit lines.

4. The SRAM cell of claim 2, wherein the first isolation buffer and the second isolation buffer comprise inverters.

5. The SRAM cell of claim 2, wherein the latch comprises a pair of inverters, and the first output node comprises the state terminal of one of said pair of inverters, and the second output node comprises the state terminal of the other of said pair of inverters.

6. The SRAM cell of claim 1, wherein the write path is open during a read operation.

7. The SRAM cell of claim 6, wherein said current limiting transistor restricts current flow from said bit lines to prevent data corruption in said latch.

8. The SRAM cell of claim 7, wherein the current limiting transistor is gated by a power supply voltage.

9. The SRAM cell of claim 6, wherein each bit line connects to a separate access transistor, and a single common current limiting transistor connects to each access transistor.

10. The SRAM cell of claim 1, wherein the write path comprises an access transistor connected in series to an enable transistor.

11. The SRAM cell of claim 10, wherein the enable transistor has a gate terminal that receives a write enable signal.

12. The SRAM cell of claim 11, wherein the enable transistor is non-conducting during a read operation.

13. The SRAM cell of claim 11, wherein the enable transistor is enabled during a write operation.

14. The SRAM cell of claim 10, wherein each bit line connects to a separate access transistor, and a single common enable transistor connects to each access transistor.

15. The SRAM cell of claim 1, wherein the latch comprises a pair of latches.

16. The SRAM cell of claim 1, wherein the first and second transistor comprise field effect transistors (FETs) connected in series between the bit line and ground.

17. A static random access memory array, comprising:
a plurality of memory cells configured in a two-dimensional array of rows and columns, each of said memory cells comprising a pair of latches that hold complementary data bit values on opposite nodes, and wherein each of said nodes couples to a uni-directional isolation buffer and to a current limiting transistor;
a plurality of ports N capable of accessing each of said memory cells, with each of said ports including:
a word line accessing at least one row of memory cells;
a pair of complementary bit lines accessing at least one column of memory cells;
wherein each of said complementary bit lines couples to one of said unidirectional isolation buffers through a read data path, and to said current limiting transistor through a write data path.

18. The static random access memory array of claim 17, wherein said read data path comprises an access transistor and a data transistor, and said access transistor is controlled by a signal on said word line, and said data transistor is controlled by an output signal from one of said uni-directional isolation buffers.

19. The static random access memory array of claim 18, wherein the access transistor comprises a field effect transistor that is gated by the signal on the word line.

20. The static random access memory array of claim 18, wherein the data transistor comprises a field effect transistor that is gated by the output signal from one of said uni-directional isolation buffers.

21. The static random access memory array of claim 20, wherein the data transistor connects at its source terminal to ground.

22. The static random access memory array claim 18, wherein the uni-directional isolation buffer comprises an inverter.

23. The static random access memory array of claim 17, wherein the write data path is open during a read cycle, and said current limiting transistor restricts current flow from said bit lines to prevent data corruption in one of said memory cells.

24. The static random access memory array of claim 17, wherein the current limiting transistor is controlled by a power supply voltage.

25. The static random access memory array of claim 17, wherein each bit line connects to a separate access transistor, and the current limiting transistor commonly connects to each access transistor.

26. The static random access memory array of claim 25, wherein the current limiting transistor comprises a field effect transistor that includes a gate terminal, and the gate terminal of the field effect transistor connects to a power supply.

27. The static random access memory array of claim 17, wherein the current limiting transistor comprises a field effect transistor that includes a gate terminal, and the gate terminal receives a write enable signal.

28. An SRAM cell, comprising:
a data latch with an output node;
a read data path line coupled to the output node, said read data path including an isolation buffer;
a write data path line coupled to the output node, said write data path including a current limiting device.

29. An SRAM cell of claim 28, wherein said isolation buffer comprises an inverter.

30. The SRAM cell of claim 28, wherein the SRAM cell couples to a plurality of ports that are capable of simultaneously reading data from said data latch.

31. The SRAM cell of claim 30, wherein each of said plurality of ports includes a word line for enabling access to said read path and said write path.

32. The SRAM cell of claim 31, wherein each of said plurality of ports further includes at least one bit line coupled to said read path and said write path.

33. The SRAM cell of claim 32, wherein said at least one bit line couples to said data path through a pull-down transistor stack.

34. The SRAM cell of claim 33, wherein said pull-down transistor stack includes a first transistor and a second transistor, and said first transistor is controlled by a signal on said word line, and said second transistor is controlled based on an output signal from said isolation buffer.

35. The SRAM cell of claim 34, wherein the second transistor comprises a field effect transistor that is gated by the output signal from said isolation buffer.

36. The SRAM cell of claim 35, wherein the second transistor connects at its source terminal to ground.

37. The SRAM cell of claim 32, wherein the write path is open during a read cycle, and said current limiting transistor restricts current flow from said at least one bit line of each of said plurality of ports to prevent data corruption in said memory cell.

38. The SRAM cell of claim 37, wherein the current limiting transistor comprises a field effect transistor that is gated by a power supply voltage.

39. The SRAM cell of claim 32, wherein each bit line connects to a separate access transistor, and the current limiting transistor commonly connects to each access transistor.

40. The SRAM cell of claim 32, wherein the current limiting transistor comprises a field effect transistor that includes a gate terminal, and the gate terminal receives a write enable signal.

* * * * *